(12) United States Patent
Oon et al.

(10) Patent No.: US 7,284,871 B2
(45) Date of Patent: Oct. 23, 2007

(54) LIGHT-EMITTING DIODE MODULE FOR FLASH AND AUTO-FOCUS APPLICATION

(75) Inventors: Su Lin Oon, Penang (MY); Kian Shin Lee, Penang (MY); Meng Ee Lee, Penang (MY); Siew It Pang, Penang (MY); Hong Huat Yeoh, Penang (MY)

(73) Assignee: Avago Technologies ECB4 IP (Singapore) Pte Ltd, Singapore (SG)

( * ) Notice: Subject to any disclaimer, the term of this patent is extended or adjusted under 35 U.S.C. 154(b) by 108 days.

(21) Appl. No.: 11/199,509

(22) Filed: Aug. 8, 2005

(65) Prior Publication Data

US 2007/0030675 A1    Feb. 8, 2007

(51) Int. Cl.
*G03B 15/03* (2006.01)

(52) U.S. Cl. .......................... 362/17; 362/11; 362/251; 396/182

(58) Field of Classification Search .................. 362/11, 362/12, 17, 184, 228, 229, 236, 237, 240, 362/242, 244, 246, 251, 268, 800; 396/164, 396/182, 205
See application file for complete search history.

(56) References Cited

U.S. PATENT DOCUMENTS

| | | | | |
|---|---|---|---|---|
| 6,068,383 A | * | 5/2000 | Robertson et al. | 362/242 |
| 6,773,139 B2 | * | 8/2004 | Sommers | 362/237 |
| 7,221,864 B2 | * | 5/2007 | Seo | 396/182 |
| 2006/0067074 A1 | * | 3/2006 | Lin | 362/244 |
| 2006/0077649 A1 | * | 4/2006 | Kumagai | 362/12 |

* cited by examiner

Primary Examiner—Y. My Quach-Lee

(57) ABSTRACT

A flash module has a first light-emitting diode ("LED") optically coupled to a first lens having a first viewing angle, and a second LED optically coupled to a second lens having a second viewing angle. The second viewing angle is greater than the first viewing angle. A first control signal line coupled to the first LED allows selectively activating the first LED. A second control signal line coupled to the second LED activates the second LED.

10 Claims, 2 Drawing Sheets

US 7,284,871 B2

LIGHT-EMITTING DIODE MODULE FOR FLASH AND AUTO-FOCUS APPLICATION

CROSS-REFERENCE TO RELATED APPLICATIONS

Not applicable.

STATEMENT REGARDING FEDERALLY SPONSORED RESEARCH OR DEVELOPMENT

Not applicable.

REFERENCE TO MICROFICHE APPENDIX

Not applicable.

BACKGROUND OF THE INVENTION

Digital still imaging devices, such as digital still cameras ("DSCs") and mobile telephones that include imaging devices ("camera phones") often need auxiliary lighting, such as from a flash module, when taking pictures in low-light conditions. DSCs and camera phones often have a built-in flash module for this purpose. It is generally desirable that the flash module produce light within the viewing angle of the camera to uniformly illuminate the object of the picture.

Different types of light sources are used to produce light for the flash. White light is generally desired to achieve good color in the image. Gas discharge tubes are one type of light source used in flash applications. Light-emitting diodes ("LEDs") are another type of light source used in flash applications. LED chips produce essentially a single color (wavelength) of light. A "white LED" is obtained by using wavelength-converting materials to convert light from an LED chip to different wavelengths, and the combination of lights from LED chip plus wavelength-converting materials will produce white light.

Auxiliary lighting is also used in some DSCs to assist in auto-focusing the device on the object before the picture is taken. A separate LED is provided for this purpose, and is commonly referred to as an "auto focus auxiliary LED ("AFA LED"). An AFA LED typically produces high brightness through a narrow viewing angle, as opposed to a flash module, which produces light through a relatively broad viewing angle, and is separate from the flash source.

FIG. 1A shows a prior art DSC 100 having an AFA LED 102 and a flash module 104. The flash module is a non-LED light source, such as a gas discharge tube. There is sufficient area on the face of the DSC 100 to put both the AFA and flash light sources; however, it is difficult to accommodate both light sources on smaller digital imaging devices, such as smaller DSCs and camera phones. AFA LEDs are often omitted from camera phones, which affects their auto-focus function, particularly in low-light conditions. It is desirable to provide an auto-focus auxiliary light that avoids the problems described above.

BRIEF SUMMARY OF THE INVENTION

A flash module has a first light-emitting diode ("LED") optically coupled to a first lens having a first viewing angle, and a second LED optically coupled to a second lens having a second viewing angle. The second viewing angle is greater than the first viewing angle. A first control signal line coupled to the first LED allows selectively activating the first LED. A second control signal line coupled to the second LED activates the second LED.

DETAILED DESCRIPTION OF THE EMBODIMENTS

Figure 1:
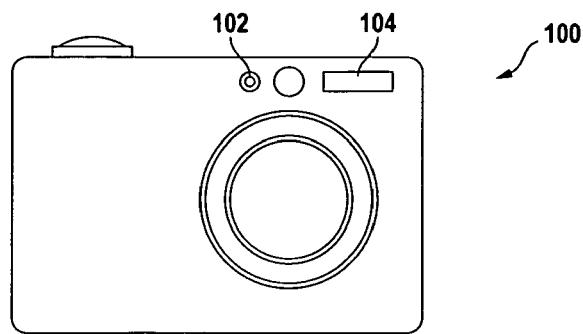
FIG. 1 shows a prior art DSC having an AFA LED and a flash module.
Figure 2:
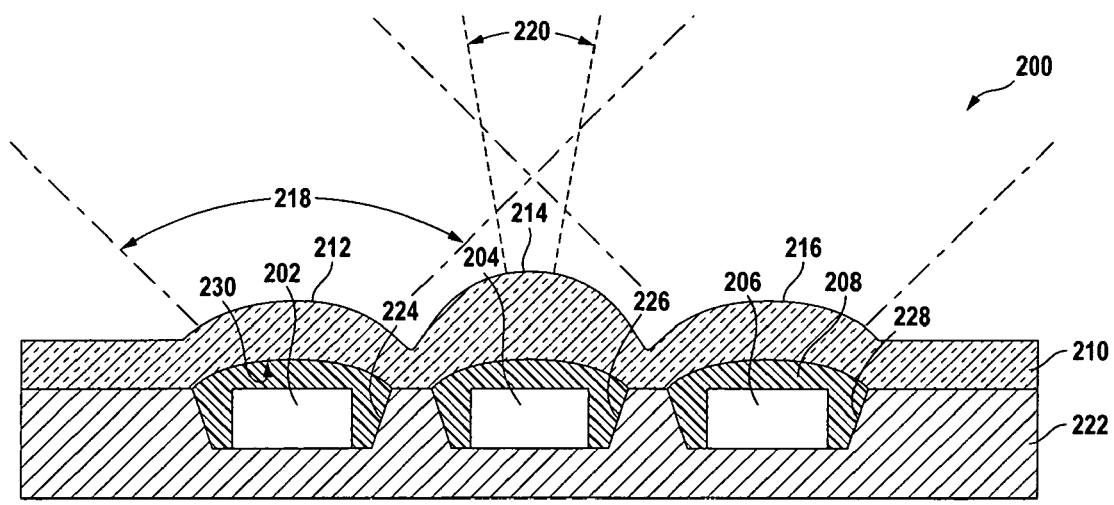
FIG. 2 is a cross section of a flash module according to an embodiment of the present invention.

FIG. 2 is a cross section of a flash module 200 according to an embodiment of the present invention. The flash module 200 has three LED chips 202, 204, 206. In a particular embodiment each LED chip emits blue light. Alternatively, each LED chip emits ultraviolet ("UV") light. In yet other embodiments, the LED chips emit different wavelengths of light. For example, the first chip 202 is a blue-emitting LED, the second chip 204 is a red-emitting LED, and the third chip 206 is a green-emitting LED. The LED used for auto-focusing can be any color compatible with the auto-focusing system. The LED chips 202, 204, 206 are covered with wavelength-converting material 208. The wavelength-converting material converts the light emitted by the LED chips (commonly referred to as "primary radiation") to other wavelengths. Thus, the blue light emitted by the LED chips is converted to different colors in the visible spectrum that combine to produce white light from the flash module 200.

In a particular embodiment, the wavelength-converting material 208 has very fine particles of phosphor materials dispersed in an epoxy resin matrix. When illuminated by the primary radiation from the LED chips, a phosphor particle emits light having a longer wavelength (commonly referred to as "secondary radiation"). Different phosphor materials emit secondary radiation at different wavelengths (colors), thus phosphor materials are combined in the epoxy resin matrix to produce white light from the primary emissions of the LED chips.

Alternatively, such as when the LED chips emit different primary radiation, different wavelength-converting materials are used with the different LED chips. Similarly, quantum dots may be used in combination with or alternatively to phosphor particles. In a yet alternative embodiment, wavelength-converting materials, such as phosphor particles and/or quantum dots, are dispersed in a matrix, such as a silicone elastomer, and applied to the top of the LED chips.

A lensed structure 210 has three lenses (optical domes) 212, 214, 216 that are optically coupled to the respective LED chips 202, 204, 206 to disperse the light in selected radiation patterns ("viewing angles"). The first 212 and third 216 optical domes disperse light at a viewing angle 218 of between about fifty-five degrees and about seventy degrees. The second optical dome 214 disperses light at a viewing angle 220 of between about eight and about ten degrees. Alternatively, the lensed structure has two optical domes. In an embodiment, the lensed structure is formed (e.g. cast or molded) as a single piece of optical polymer.

The LED chips 202, 204, 206 are mounted on a substrate 222, typically within reflective cups 224, 226, 228. The substrate is a plastic package substrate, a printed circuit board substrate, or a leadframe substrate, for example. The wavelength-converting material is dispensed onto the package substrate in liquid form and cured, the lensed structure 210 is secured to the package substrate 222. In a particular embodiment, the cured wavelength-converting epoxy secures the lensed structure to the package substrate. Alternatively, or adhesive, either filling the reflective cups or at the interface of the two components, or heat bonding is used to secure the lensed structure to the package substrate. Thus, the wavelength-converting material 208 essentially fills the space between the LED chips and the lensed structure 210. The curvatures of the surfaces of the lenses opposing the LED chips are selected in cooperation with the outer surfaces of the lenses to provide the desired radiation pattern. The wavelength-converting material provides index matching between the LED chips and the lensed structure, improving the efficiency of the flash module.

The distance between the emitting surface of an LED chip 202 and an opposing surface 230 of the lensed structure is selected to provide the desired wavelength conversion(s) without unduly decreasing light intensity. For example, an epoxy matrix that is lightly loaded with phosphor material is thicker than one that is heavily loaded. If primary radiation contributes to the color of ("combined emissions") the flash module, such as when using blues LEDs, a thick layer of heavily loaded wavelength-converting material might remove too much primary radiation from the flash light, which alters the color balance.

The second LED chip 204 is independently controllable from the first and third LED chips 202, 206. During operation of an imaging device, the second LED chip 204 is activated to provide a bright, narrow light beam to enhance contrast and enable the DSC sensor to focus in environments having dim lighting. The imaging device focuses on the object, which is illuminated by the second LED chip 204 and second optical dome 214. Then, all three LED chips 202, 204, 206 are activated to provide a flash that illuminates the object turning image capture. A wider radiation pattern is desirable during flash operation to more uniformly illuminate the object. Alternatively, the second LED chip 204 is not activated during the flash operation.

Figure 3:
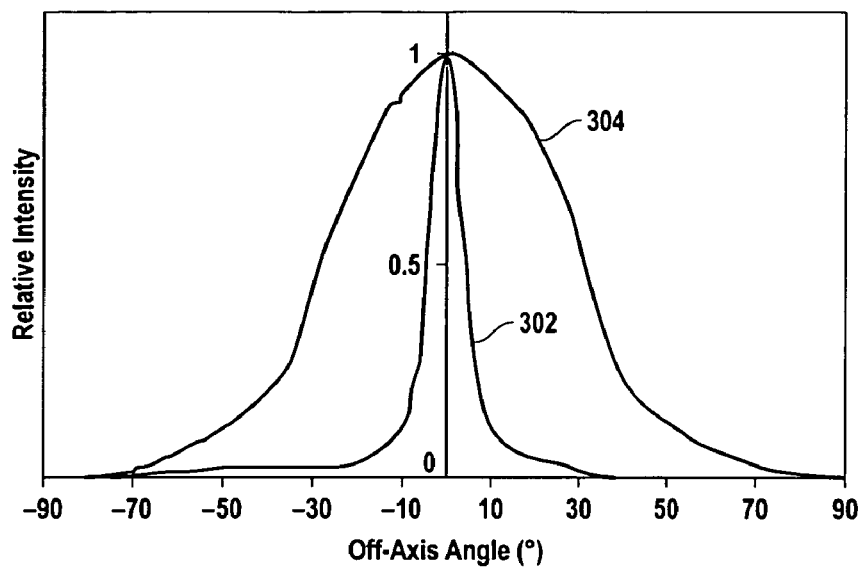
FIG. 3 shows plots of relative light intensity versus off-axis angle of the light source of FIG. 2 in both AF mode and flash mode.

FIG. 3 shows plots of relative light intensity versus off-axis angle (i.e. beam spread) at the distance from the imager (i.e. light source) to the object for the flash module of FIG. 2. A first plot 302 shows the light distribution at the object when the second LED chip (refer to FIG. 2, ref. num. 204) is activated to provide auxiliary light for auto-focusing. A second plot 304 shows the light distribution at the object when the first, second, and third LED chips (refer to FIG. 2, ref. nums. 202, 204, 206) are activated to provide a flash function. In a particular embodiment, the LED chip 204 is driven at about 30 mA to about 50 mA in during an auto-focus operation, and is driven at less than 30 mA during the flash operation.

Figure 4:
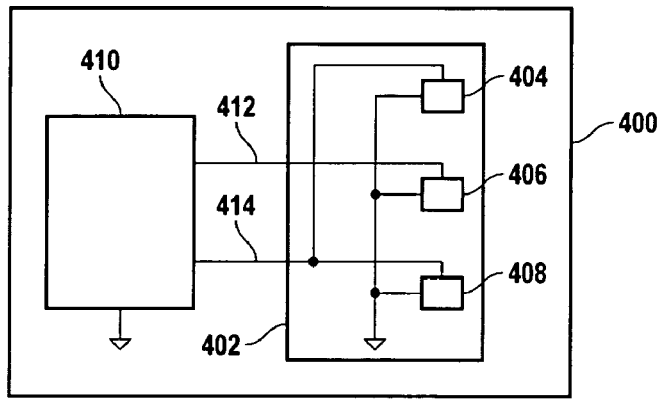
FIG. 4 is a diagram of an imaging device according to an embodiment of the present invention.

FIG. 4 is a diagram of a portion of an imaging device 400 according to an embodiment of the present invention. The imaging device 400 includes a flash module 402 having a plurality of LEDs 404, 406, 408. Each of the LEDs has an associated lens (not shown, see FIG. 2, ref. nums 212, 214, 216). The LEDs are LED chips or alternatively LED chips with a wavelength-converting layer. In the latter instance, additional wavelength-converting material (see FIG. 2, ref. num. 208) is not required; however, material may be used to index-match between the LEDs and the lenses. The radiation pattern from the first and third LEDs 404, 408 is wider than the radiation pattern from the second LED 406. In a particular embodiment, each of the LEDs is a white-emitting LED.

The imaging device has a flash module control circuit 410 that provides control signals to the flash module 402 on control signal lines 412, 414. A first control signal activates only the second LED 406 during an AFA operation. A second control signal activates the first and third LEDs 404, 408 during a flash operation. In one embodiment, the second LED 406 is also activated by the first control signal during the flash operation. The lens designs avoids formation of a central "hot spot" (i.e. a region that is illuminated more than its surroundings) during image capture. In an alternative embodiment, the second LED 406 is activated by a third control signal during the flash operation. In an embodiment, the third control signal biases the second LED at a lower current than the second control signal. This insures sufficient brightness during the flash operation and further avoids a central hot spot. In a yet further embodiment, the second LED 406 is activated during the flash operation by the same control signal that activates the first and third LEDs 404, 408.

Figure 5:
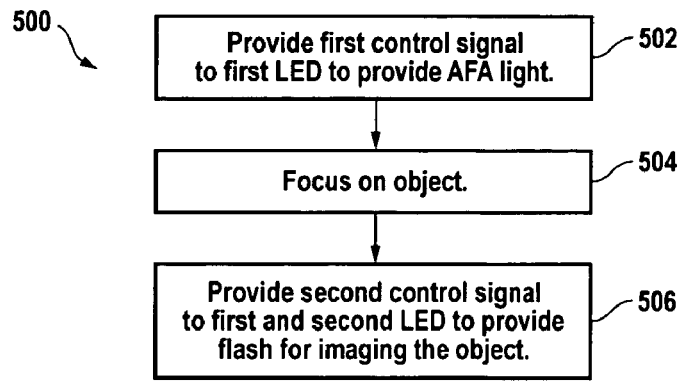
FIG. 5 is a flow chart of a method of operating an imaging device according to an embodiment of the invention.

FIG. 5 is a flow chart of a method of operating an imaging device 500 according to an embodiment of the invention. A first control signal is provided to a flash module to activate a first LED in the flash module to provide an AFA light beam (step 502). The imaging device focuses on an object (step 504), and then a second control signal is provided to the flash module to activate at least a second LED in the flash module to provide an auxiliary flash beam ("flash") (step 506). In a particular embodiment, the second control signal also activates the first LED. In a further embodiment, the second control signal activates additional LEDs during the flash. In a particular embodiment, the first and second LEDs are white-emitting LEDs.

While the preferred embodiments of the present invention have been illustrated in detail, it should be apparent that modifications and adaptations to these embodiments might occur to one skilled in the art without departing from the scope of the present invention as set forth in the following claims.

What is claimed is:

1. A flash module comprising:
   a first light-emitting diode (LED);
   a first lens optically coupled to the first LED having a first viewing angle;
   a second LED;
   a second lens optically coupled to the second LED having a second viewing angle less than the first viewing angle;
   a first control signal line coupled to the second LED to selectively activate the second LED with a first current that is selected to place the second LED in an auto-focus mode of operation; and
   a second control signal line coupled to the first LED to activate the first LED with a second current that is selected to place the first LED in a flash mode of operation, wherein the first current is greater than the second current.

2. The flash module of claim 1 wherein the first current is not less than approximately 30 mA and the second current is less than approximately 30 mA.

3. The flash module of claim 1 further comprising:
   a third LED;
   a third lens optically coupled to the third LED having a third viewing angle, wherein the second control signal is also coupled to the third LED for concurrently activating the first and third LEDs in the flash mode of operation.

4. The flash module of claim 3 wherein the third viewing angle is essentially equal to the first viewing angle.

5. The flash module of claim 3 wherein the first LED is a first white LED, the second LED is a second white LED, and the third LED is a third white LED.

6. The flash module of claim 1 wherein the first lens, the second lens, and the third lens are incorporated in a lensed structure.

7. The flash module of claim 6 further comprising wavelength-converting material disposed between the lensed structure and the first LED, the second LED, and the third LED.

8. The flash module of claim 7 wherein the wavelength-converting material comprises phosphor particles dispersed in an epoxy matrix.

9. The flash module of claim 8 wherein the wavelength-converting material extends from the second LED to an opposing surface of the lensed structure.

10. The flash module of claim 1 wherein the second viewing angle is between about eight degrees and about ten degrees and the first viewing angle is between about fifty-five degrees and about seventy degrees.

* * * * *